United States Patent
Jia (10) Patent No.: US 9,634,670 B2
(45) Date of Patent: Apr. 25, 2017

(54) FREQUENCY DIVIDER AND RELATED ELECTRONIC DEVICE

(71) Applicant: Semiconductor Manufacturing International (Shanghai) Corporation, Shanghai (CN)

(72) Inventor: Hailong Jia, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 118 days.

(21) Appl. No.: 14/805,000

(22) Filed: Jul. 21, 2015

(65) Prior Publication Data

US 2016/0072507 A1 Mar. 10, 2016

(30) Foreign Application Priority Data

Sep. 4, 2014 (CN) .......................... 2014 1 0447098

(51) Int. Cl.
*H03K 21/00* (2006.01)
*H03K 21/02* (2006.01)
*H03K 21/10* (2006.01)
*H03L 7/14* (2006.01)
*H03L 7/18* (2006.01)

(52) U.S. Cl.
CPC ............ *H03K 21/02* (2013.01); *H03K 21/00* (2013.01); *H03K 21/023* (2013.01); *H03K 21/026* (2013.01); *H03K 21/10* (2013.01); *H03L 7/148* (2013.01); *H03L 7/18* (2013.01)

(58) Field of Classification Search
None
See application file for complete search history.

(56) References Cited

U.S. PATENT DOCUMENTS

| | | | | |
|---|---|---|---|---|
| 8,035,453 | B1* | 10/2011 | Wong | H03K 3/0322 327/158 |
| 8,093,928 | B2* | 1/2012 | Chang | H03K 3/0315 327/115 |
| 8,456,202 | B2 | 6/2013 | Gu et al. | |
| 8,784,669 | B2 | 7/2014 | Bain et al. | |
| 2006/0145743 | A1* | 7/2006 | Neubauer | H03K 3/00 327/203 |
| 2010/0039153 | A1 | 2/2010 | Qiao et al. | |
| 2011/0001521 | A1* | 1/2011 | Lorenzon | H03K 23/52 327/115 |

(Continued)

*Primary Examiner* — Tuan T Lam
(74) *Attorney, Agent, or Firm* — Innovation Counsel LLP (57) ABSTRACT

A frequency divider may include the following elements: a first inverter, a second inverter, and a third inverter, which are connected in a ring structure, wherein the second inverter is connected to an output terminal of the frequency divider; a fourth inverter connected to a first input terminal of the frequency divider and to a power supply terminal of the first inverter; a fifth inverter connected to a second input terminal of the frequency divider and to a power supply terminal of the third inverter; a first transistor connected to the second input terminal of the frequency divider and to a ground terminal of the first inverter; and a second transistor connected to the first input terminal of the frequency divider and to a ground terminal of the third inverter. The second inverter, the fourth inverter, and the fifth inverter may receive a power supply voltage.

20 Claims, 3 Drawing Sheets

(56) References Cited

U.S. PATENT DOCUMENTS

| | | | | |
|---|---|---|---|---|
| 2012/0081156 | A1* | 4/2012 | Hesen | H03K 21/12 |
| | | | | 327/115 |
| 2012/0299626 | A1* | 11/2012 | Fujita | H03K 23/44 |
| | | | | 327/115 |
| 2014/0070853 | A1 | 3/2014 | Sankaran et al. | |
| 2014/0361814 | A1* | 12/2014 | Connell | H03K 3/012 |
| | | | | 327/115 |
| 2014/0361821 | A1* | 12/2014 | Connell | H03K 3/356104 |
| | | | | 327/218 |
| 2016/0173069 | A1* | 6/2016 | Kossel | H03K 3/0315 |
| | | | | 331/57 |

* cited by examiner

FREQUENCY DIVIDER AND RELATED ELECTRONIC DEVICE

CROSS-REFERENCE TO RELATED APPLICATION

This application claims priority to and benefit of Chinese Patent Application No. 201410447098.5, filed on 4 Sep. 2014; the Chinese Patent Application is incorporated herein by reference in its entirety.

BACKGROUND OF THE INVENTION

The present invention is related to a frequency divider and an electronic device that includes the frequency divider.

A frequency divider may receive an input signal having an input frequency to generate an output signal having an output frequency, such that the output frequency is a fraction of the input frequency. Frequency dividers may be used in a phase-locked loop frequency synthesizer for generating a frequency that is a multiple of a reference frequency. Frequency dividers may be used in various electronic devices, such as communication devices.

Some existing frequency dividers may be used in applications associated with relatively high frequencies. Nevertheless, power consumption of the frequency dividers may be undesirably high.

Some existing frequency dividers may operate with relatively low power consumption. Nevertheless, the frequency dividers may not be applicable in applications associated with high frequencies.

SUMMARY

An embodiment of the present invention may be related to a frequency divider. The frequency divider may include a first inverter, a second inverter, a third inverter, a fourth inverter, a fifth inverter, a first transistor, and a second transistor. The first inverter, the second inverter, the third inverter, the fourth inverter, and the fifth inverter may be CMOS (complementary metal-oxide-semiconductor) inverters, which may be hardware elements. Electrical connections described in this application may be direct electrical connections and/or may not involve intervening (or intermediate) transistors.

The first inverter, the second inverter, and the third inverter may be electrically connected in a ring structure. An input terminal of the first inverter may be electrically connected to an output terminal of the third inverter. An input terminal of the second inverter may be electrically connected to an output terminal of the first inverter. An input terminal of the third inverter may be electrically connected to an output terminal of the second inverter.

The output terminal of the second inverter may be electrically connected to an output terminal of the frequency divider. A power supply terminal of the second inverter may be configured to receive a power supply voltage. A ground terminal of the second inverter may be configured to receive a reference voltage or may be grounded.

An input terminal of the fourth inverter may be electrically connected to a first input terminal of the frequency divider. An output terminal of the fourth inverter may be electrically connected to a power supply terminal of the first inverter. A power supply terminal of the fourth inverter may be configured to receive the power supply voltage. A ground terminal of the fourth inverter may be configured to receive the reference voltage or may be grounded.

An input terminal of the fifth inverter may be electrically connected to a second input terminal of the frequency divider. An output terminal of the fifth inverter may be electrically connected to a power supply terminal of the third inverter. A power supply terminal of the fifth inverter may be configured to receive the power supply voltage. A ground terminal of the fifth inverter may be configured to receive the reference voltage or may be grounded.

A source terminal of the first transistor may be configured to receive the reference voltage or may be grounded. A drain terminal of the first transistor may be electrically connected to a ground terminal of the first inverter. A gate terminal of the first transistor may be electrically connected to the second input terminal of the frequency divider.

A source terminal of the second transistor may be configured to receive the reference voltage or may be grounded. A drain terminal of the second transistor may be electrically connected to a ground terminal of the third inverter. A gate terminal of the second transistor may be electrically connected to the first input terminal of the frequency divider.

Each of an electrical connection from the input terminal of the second inverter to the output terminal of the first inverter, an electrical connection from the power supply terminal of the second inverter to a power supply unit that is configured to provide the power supply voltage, and an electrical connection from the ground terminal of the second inverter to ground may involve no intervening transistor.

An electrical connection from the input terminal of the third inverter to the output terminal of the second inverter may involve no intervening transistor. An electrical connection from the output terminal of the third inverter to the input terminal of the first inverter may not involve any intervening transistor.

Each of an electrical connection from the input terminal of the fourth inverter to the first input terminal of the frequency divider, an electrical connection from the output terminal of the fourth inverter to the power supply terminal of the first inverter, an electrical connection from the power supply terminal of the fourth inverter to a power supply unit that is configured to provide the power supply voltage, and an electrical connection from a ground terminal of the fourth inverter to ground may involve no intervening transistor.

Each of an electrical connection from the input terminal of the fifth inverter to the second input terminal of the frequency divider, an electrical connection from the output terminal of the fifth inverter to the power supply terminal of the third inverter, an electrical connection from the power supply terminal of the fifth inverter to a power supply unit that is configured to provide the power supply voltage, and an electrical connection from the ground terminal of the fifth inverter to ground may involve no intervening transistor.

Each of an electrical connection from the source terminal of the first transistor to ground, an electrical connection from the drain terminal of the first transistor to the ground terminal of the first inverter, and an electrical connection from the gate terminal of the first transistor to the second input terminal of the frequency divider may involve no intervening transistor.

Each of an electrical connection from the source terminal of the second transistor to ground, and electrical connection from the drain terminal of the second transistor to the ground terminal of the third inverter, and an electrical connection from the gate terminal of the second transistor to the first input terminal of the frequency divider may involve no intervening transistor.

The fourth inverter may include a third transistor and a fourth transistor. The third transistor may be P-type. The fourth transistor may be N-type. A source terminal of the third transistor may be configured to receive the power supply voltage. A drain terminal of the third transistor may be electrically connected to a drain terminal of the fourth transistor. A gate terminal of the third transistor may be electrically connected to a gate terminal of the fourth transistor and may be electrically connected to the first input terminal of the frequency divider. A source terminal of the fourth transistor may be configured to receive the reference voltage or may be grounded.

The fifth inverter may include a fifth transistor and a sixth transistor. The fifth transistor may be P-type. The sixth transistor may be N-type. A source terminal of the fifth transistor may be configured to receive the power supply voltage. A drain terminal of the fifth transistor may be electrically connected to a drain terminal of the sixth transistor. A gate terminal of the fifth transistor may be electrically connected to a gate terminal of the sixth transistor and may be electrically connected to the second input terminal of the frequency divider. A source terminal of the sixth transistor may be configured to receive the reference voltage or may be grounded.

The first inverter may include a seventh transistor and an eighth transistor. The eighth transistor may be P-type. The seventh transistor may be N-type. A source terminal of the eighth transistor may be electrically connected to the output terminal of the fourth inverter. A drain terminal of the eighth transistor may be electrically connected to a drain terminal of the seventh transistor. A gate terminal of the eighth transistor may be electrically connected to a gate terminal of the seventh transistor. A source terminal of the seventh transistor may be electrically connected to a drain electrode of the first transistor.

The second inverter may include a tenth transistor and a ninth transistor. The tenth transistor may be P-type. The ninth transistor may be N-type. A source terminal of the tenth transistor may be configured to receive the power supply voltage. A drain terminal of the tenth transistor may be electrically connected to a drain terminal of the ninth transistor. A gate terminal of the tenth transistor may be electrically connected to a gate terminal of the ninth transistor and may be electrically connected to the output terminal of the first inverter. A source terminal of the ninth transistor may be configured to receive the reference voltage or may be grounded. Each of the gate terminal of the tenth transistor and the gate terminal of the ninth transistor may be electrically connected to drain terminals of two transistors of the first inverter.

The third inverter may include an eleventh transistor and a twelfth transistor. The twelfth transistor may be P-type. The eleventh transistor may be N-type. A source terminal of the twelfth transistor may be electrically connected to the output terminal of the fifth inverter. A drain terminal of the twelfth transistor may be electrically connected to a drain terminal of the eleventh transistor. A gate terminal of the twelfth transistor may be electrically connected to a gate terminal of the eleventh transistor. Each of the gate terminal of the twelfth transistor and the gate terminal of the eleventh transistor may be electrically to drain terminals of two transistors of the second inverter. Each of the gate terminal of the twelfth transistor and the gate terminal of the eleventh transistor may be electrically to the output terminal of the frequency divider. A source terminal of the eleventh transistor may be electrically connected to a drain electrode of the second transistor.

The first input terminal of the frequency divider and the second input terminal of the frequency divider may be configured to receive a differential signal pair.

The output terminal of the frequency divider may include a sixth inverter. An input terminal of the sixth inverter may be electrically connected to the output terminal of the second inverter. An output of the sixth inverter may be an output of the frequency divider.

An electrical connection from the input terminal of the sixth inverter to the output terminal of the second inverter may involve no intervening transistor.

The output terminal of the frequency divider may include a differential output structure.

The output terminal of the frequency divider may include frequency dividers that are electrically connected in a cascade structure.

An embodiment of the present invention may be related to an electronic device. The electronic device may include an electronic component and a frequency divider that is electrically connected to the electronic component. The frequency divider may have one or more of the aforementioned features.

According to embodiments of the invention, a frequency divider may include CMOS inverters connected in dynamic configurations. The frequency divider may include frequency dividers connected in a cascade connection structure. Advantageously, the frequency divider and/or an electronic device that includes the frequency divider may operate at a substantially high speed with substantially low power consumption and may operate in applications associated with high frequencies.

The above summary is related to some of many embodiments of the invention disclosed herein and is not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
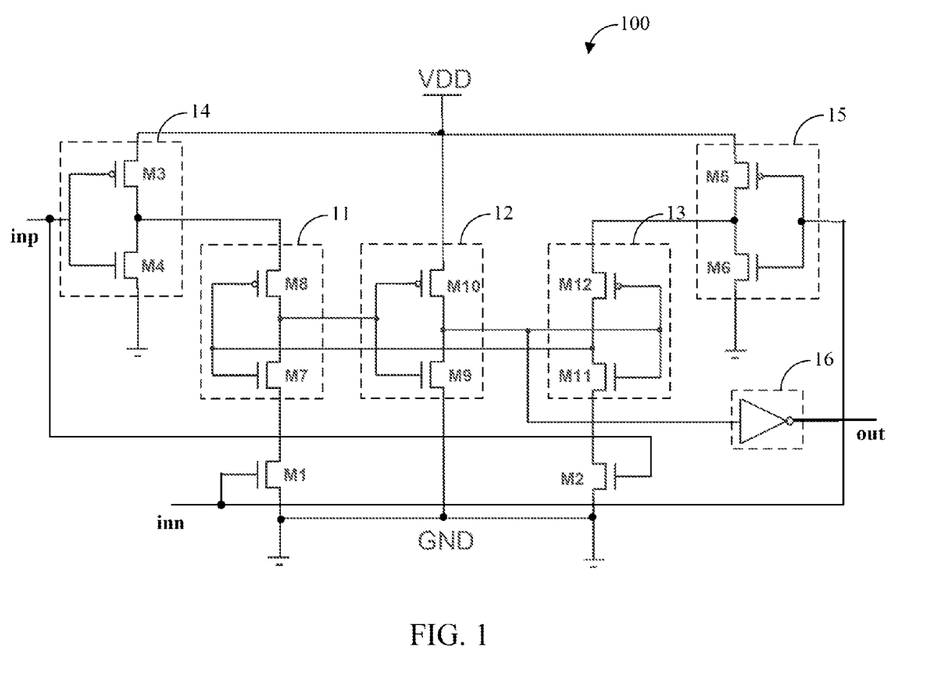
FIG. 1 shows a schematic diagram (e.g., a schematic circuit diagram) that illustrates elements and/or structures in a frequency divider in accordance with one or more embodiments of the present invention.

FIG. 1 shows a schematic diagram (e.g., a schematic circuit diagram) that illustrates elements and/or structures in a frequency divider 100 in accordance with one or more embodiments of the present invention. The frequency divider 100 may include a first inverter 11, a second inverter 12, a third inverter 13, a fourth inverter 14, a fifth inverter 15, a first transistor M1, and a second transistor M2. The first inverter 11, the second inverter 12, the third inverter 13, the fourth inverter 14, and the fifth inverter 15 may be CMOS (complementary metal-oxide-semiconductor) inverters.

The first inverter 11, the second inverter 12, and the third inverter 13 may be electrically connected in a ring structure. An input terminal of the first inverter 11 may be electrically connected to an output terminal of the third inverter 13. An input terminal of the second inverter 12 may be electrically connected to an output terminal of the first inverter 11. An input terminal of the third inverter 13 may be electrically connected to an output terminal of the second inverter 12.

The output terminal of the second inverter 12 may also be electrically connected to an output terminal of the frequency divider 100. The output terminal of the frequency divider 100 may output a signal "out". A power supply terminal of the second inverter 12 may be configured to receive a power supply voltage VDD and may be electrically connected to a power supply unit. A ground terminal of the second inverter 12 may be configured to receive a reference voltage GND and/and/or may be grounded.

A first input terminal of the frequency divider 100 and a second input terminal of the frequency divider 100 may be configured to receive a differential signal pair. The first input terminal of the frequency divider 100 may receive an input signal "inp". The second input terminal of the frequency divider 100 may receive an input signal "inn". When "inp"

is a high voltage, "inn" is a low voltage. When "inp" is a low voltage, "inn" is a high voltage.

An input terminal of the fourth inverter 14 may be electrically connected to the first input terminal of the frequency divider 100 and may receive the signal "inp". An output terminal of the fourth inverter 14 may be electrically connected to a power supply terminal of the first inverter 11. A power supply terminal of the fourth inverter 14 may be configured to receive the power supply voltage VDD. A ground terminal of the fourth inverter 14 may be configured to receive the reference voltage GND and/or may be grounded.

An input terminal of the fifth inverter 15 may be electrically connected to the second input terminal of the frequency divider 100 and may receive the signal "inn". An output terminal of the fifth inverter 15 may be electrically connected to a power supply terminal of the third inverter 13. A power supply terminal of the fifth inverter 15 may be configured to receive the power supply voltage VDD. A ground terminal of the fifth inverter 15 may be configured to receive the reference voltage GND and/or may be grounded.

A source terminal of the first transistor M1 may be configured to receive the reference voltage GND and/or may be grounded. A drain terminal of the first transistor Ml may be electrically connected to a ground terminal of the first inverter 11. A gate terminal of the first transistor Ml may be electrically connected to the second input terminal of the frequency divider 100 and may receive the signal "inn".

A source terminal of the second transistor M2 may be configured to receive the reference voltage GND and/or may be grounded. A drain terminal of the second transistor M2 may be electrically connected to a ground terminal of the third inverter 13. A gate terminal of the second transistor M2 may be electrically connected to the first input terminal of the frequency divider 100 and may receive the signal "inp".

Each of an electrical connection from the input terminal of the second inverter 12 to the output terminal of the first inverter 11, an electrical connection from the power supply terminal of the second inverter 12 to a power supply unit that is configured to provide the power supply voltage VDD, and an electrical connection from the ground terminal of the second inverter 12 to ground may involve no intervening transistor. For example, in an electrical connection, the input terminal of the second inverter 12 may be electrically connected to the output terminal of the first inverter 11 not through any intervening transistor.

An electrical connection from the input terminal of the third inverter 13 to the output terminal of the second inverter 12 may involve no intervening transistor. An electrical connection from the output terminal of the third inverter 13 to the input terminal of the first inverter 11 may not involve any intervening transistor.

Each of an electrical connection from the input terminal of the fourth inverter 14 to the first input terminal of the frequency divider 100, an electrical connection from the output terminal of the fourth inverter 14 to the power supply terminal of the first inverter 11, an electrical connection from the power supply terminal of the fourth inverter 14 to the power supply unit that is configured to provide the power supply voltage VDD, and an electrical connection from a ground terminal of the fourth inverter 14 to ground may involve no intervening transistor.

Each of an electrical connection from the input terminal of the fifth inverter 15 to the second input terminal of the frequency divider 100, an electrical connection from the output terminal of the fifth inverter 15 to the power supply terminal of the third inverter 13, an electrical connection from the power supply terminal of the fifth inverter 15 to a power supply unit that is configured to provide the power supply voltage VDD, and an electrical connection from the ground terminal of the fifth inverter 15 to ground may involve no intervening transistor.

Each of an electrical connection from the source terminal of the first transistor M1 to ground, an electrical connection from the drain terminal of the first transistor M1 to the ground terminal of the first inverter 11, and an electrical connection from the gate terminal of the first transistor M1 to the second input terminal of the frequency divider 100 may involve no intervening transistor.

Each of an electrical connection from the source terminal of the second transistor M2 to ground, and electrical connection from the drain terminal of the second transistor M2 to the ground terminal of the third inverter 13, and an electrical connection from the gate terminal of the second transistor M2 to the first input terminal of the frequency divider 100 may involve no intervening transistor.

The fourth inverter 14 may include a third transistor M3 and a fourth transistor M4. The third transistor M3 may be P-type (e.g., a PMOS transistor). The fourth transistor M4 may be N-type (e.g., an NMOS transistor). A source terminal of the third transistor M3 may be configured to receive the power supply voltage VDD. A drain terminal of the third transistor M3 may be electrically connected to a drain terminal of the fourth transistor M4. Both a gate terminal of the third transistor M3 and a gate terminal of the fourth transistor M4 may be electrically connected to the first input terminal of the frequency divider 100 for receiving the signal "inp". A source terminal of the fourth transistor M4 may be configured to receive the reference voltage GND and/or may be grounded.

The fifth inverter 15 may include a fifth transistor M5 and a sixth transistor M6. The fifth transistor M5 may be P-type. The sixth transistor M6 may be N-type. A source terminal of the fifth transistor M5 may be configured to receive the power supply voltage VDD. A drain terminal of the fifth transistor M5 may be electrically connected to a drain terminal of the sixth transistor M6. Both a gate terminal of the fifth transistor M5 and a gate terminal of the sixth transistor M6 may be electrically connected to the second input terminal of the frequency divider 100 for receiving the signal "inn". A source terminal of the sixth transistor M6 may be configured to receive the reference voltage GND and/or may be grounded.

The first inverter 11 may include a seventh transistor M7 and an eighth transistor M8. The eighth transistor M8 may be P-type. The seventh transistor M7 may be N-type. A source terminal of the eighth transistor M8 may be electrically connected to the output terminal of the fourth inverter 14 (and electrically connected to the drain electrodes of the transistors M3 and M4). A drain terminal of the eighth transistor M8 may be electrically connected to a drain terminal of the seventh transistor M7. A gate terminal of the eighth transistor M8 may be electrically connected to a gate terminal of the seventh transistor M7. A source terminal of the seventh transistor M7 may be electrically connected to a drain electrode of the first transistor Ml.

The second inverter 12 may include a tenth transistor M10 and a ninth transistor M9. The tenth transistor M10 may be P-type. The ninth transistor M9 may be N-type. A source terminal of the tenth transistor M10 may be configured to receive the power supply voltage VDD. A drain terminal of the tenth transistor M10 may be electrically connected to a drain terminal of the ninth transistor M9. Both the drain terminal of the tenth transistor M10 and the drain terminal of the ninth transistor M9 may be electrically connected to the output terminal of the frequency divider 100. A gate terminal of the tenth transistor M10 may be electrically connected to a gate terminal of the ninth transistor M9 and may be electrically connected to the output terminal of the first inverter 11. A source terminal of the ninth transistor M9 may be configured to receive the reference voltage GND and/or may be grounded. Each of the gate terminal of the tenth transistor M10 and the gate terminal of the ninth transistor M9 may be electrically connected to the drain terminals of the transistors M8 and M7 of the first inverter 11.

The third inverter 13 may include an eleventh transistor M11 and a twelfth transistor M12. The twelfth transistor M12 may be P-type. The eleventh transistor M11 may be N-type. A source terminal of the twelfth transistor M12 may be electrically connected to the output terminal of the fifth inverter 15 (and electrically connected to the drain electrodes of the transistors M5 and M6). A drain terminal of the twelfth transistor M12 may be electrically connected to a drain terminal of the eleventh transistor M11. Both the drain terminal of the twelfth transistor M12 and the drain terminal of the eleventh transistor M11 may be electrically connected to the gate terminals of the transistors M8 and M7. A gate terminal of the twelfth transistor M12 may be electrically connected to a gate terminal of the eleventh transistor M11. Each of the gate terminal of the twelfth transistor M12 and the gate terminal of the eleventh transistor M11 may be electrically to the drain terminals of the transistors M10 and M9 of the second inverter 12. Each of the gate terminal of the twelfth transistor M12 and the gate terminal of the eleventh transistor M11 may be electrically to the output terminal of the frequency divider 100. A source terminal of the eleventh transistor M11 may be electrically connected to a drain electrode of the second transistor M2.

The output terminal of the frequency divider 100 may include a sixth inverter 16. An input terminal of the sixth inverter 16 may be electrically connected to the output terminal of the second inverter 12 (and electrically connected to the drain terminals of the transistors M10 and M9). An output of the sixth inverter 16 may be the output signal "out" of the frequency divider 100.

An electrical connection from the input terminal of the sixth inverter 16 to the output terminal of the second inverter 12 may involve no intervening transistor.

Each of the aforementioned electrical connections may be a direct electrical connection and/or may not involve any intervening transistor.

Based on the structure and the differential signal input of the frequency divider 100, at any time in operation, the second inverter 12 and only one of the first inverter 11 and the third inverter may perform inversion; the other one of the first inverter 11 and the third inverter may lose connection to the power supply voltage VDD, may lose connection to the reference voltage GND, and/or may output an output signal according to the previous state.

For example, when the input signal "inp" is a low voltage and the input signal "inn" is a high voltage, the source terminal of the transistor M12 be grounded and may receive the reference voltage, which may be equal to the low voltage, and the source terminal of the transistor M11 may be floating, such that the output signal of the third inverter 13 may be the same as the output signal of the second inverter 12. The source terminal of the transistor M8 may be electrically connected to the power supply unit to receive the power supply voltage VDD, and the source terminal of the transistor M7 may be connected to ground, such that the first inverter 11 may invert the output signal of the third inverter 13. The source terminal of the transistor M10 may receive the power supply voltage VDD, and the source terminal of the transistor M9 may be connected to ground, such that the second inverter 12 may invert the output signal of the first inverter 11 to generate the output signal of the second inverter 12. The sixth inverter 16 may invert the output signal of the second inverter 12 to generate the output signal "out" of the frequency divider 100.

When the input signal "inp" is a high voltage and the input signal "inn" is a low voltage, the source terminal of the transistor M12 may be electrically connected to the power supply unit to receive the power supply voltage VDD, and the source terminal of the transistor M11 may be connected to ground, such that the third inverter 13 may invert the output signal of the second inverter 12. The source terminal of the transistor M8 be grounded and may receive the reference voltage, which may be equal to the low voltage, and the source terminal of the transistor M7 may be floating, such that the output signal of the first inverter 11 may be the same as the output signal of the third inverter 13. The source terminal of the transistor M10 may receive the power supply voltage VDD, and the source terminal of the transistor M9 may be connected to ground, such that the second inverter 12 may invert the output signal of the first inverter 11 to generate the output signal of the second inverter 12. The sixth inverter 16 may invert the output signal of the second inverter 12 to generate the output signal "out" of the frequency divider 100.

The frequency of the signal "out" may be equal to ½ of the frequency of the signals "inn" and "inp". The frequency divider 100 may function as a divide-by-2 frequency divider.

Figure 2:
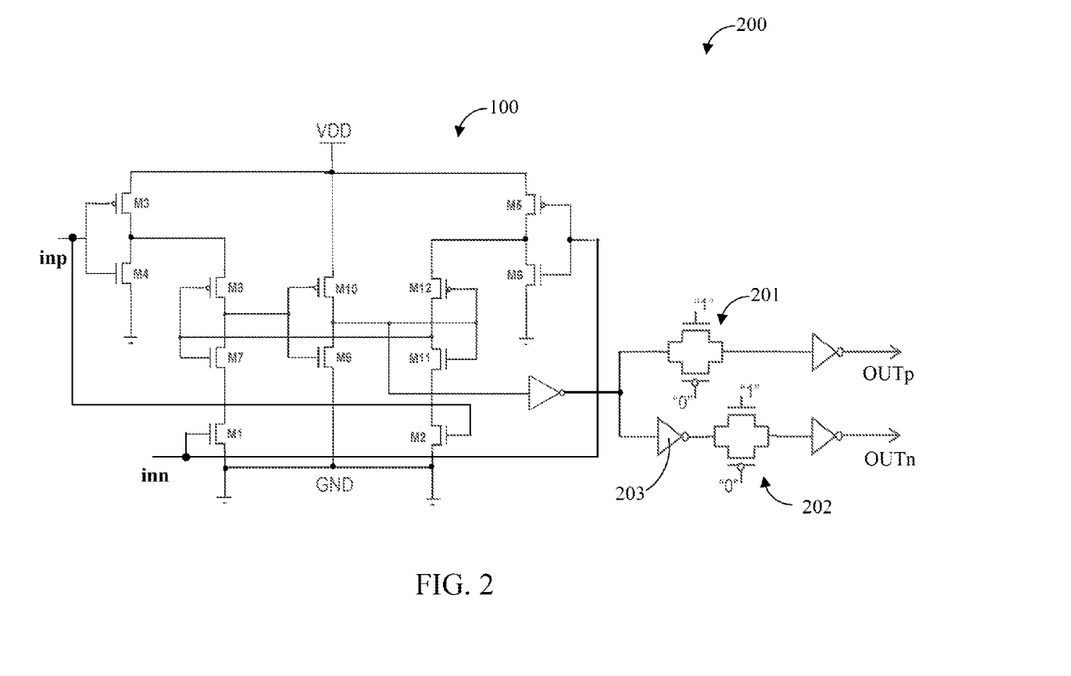
FIG. 2 shows a schematic diagram (e.g., a schematic circuit diagram) that illustrates elements and/or structures in a frequency divider in accordance with one or more embodiments of the present invention.

FIG. 2 shows a schematic diagram (e.g., a schematic circuit) that illustrates elements and/or structures in a frequency divider 200 in accordance with one or more embodiments of the present invention. The frequency divider 200 may include frequency dividers that are electrically connected in a cascade structure for performing frequency division by more than 2, e.g., 4 or 8.

In an embodiment, the frequency divider 200 may include the frequency divider 100 (discussed with reference to the example of FIG. 1), a transmission gate 201, and a transmission gate 202 that are electrically connected in a cascade structure. Each of the transmission gates 201 and 202 may include an NMOS transistor and a PMOS transistor, with the gate terminal of the NMOS transistor being electrically connected to the power supply voltage VDD (e.g., corresponding to the value "1") and with the gate terminal of the PMOS transistor being connected to the reference voltage GND (e.g., corresponding to the value "0"), for transmitting signals with a short delay.

The output terminal of the frequency divider 100 may include a differential output structure. The differential output structure may include an inverter 203. A first copy of the output signal of the frequency divider 100 may be used for generating a first differential signal pair (analogous to "inn" and "inp") as an input signal for the transmission gate 201. A second copy of the output signal of the frequency divider 100 may be inverted by the inverter 203 to generate an inverted signal, and the inverted signal may be used for generating a second differential signal pair (analogous to "inp" and "inn") as an input signal for the transmission gate 202.

The output terminal of the frequency divider 200 may include a differential output structure. An output signal OUTp of the frequency divider 200 and an output signal OUTn of the frequency divider 200 may form a differential signal pair. The signal OUTp may be an inverse of the signal OUTn.

As can be appreciated from the foregoing, frequency dividers according to embodiments of the invention may be implemented using CMOS inverters connected in dynamic configurations with substantially simple and/or limited inversion operations. Advantageously, frequency dividers according to embodiments of the invention may be applicable to applications associated with substantially high frequencies and may operate at a substantially high speed with substantially low power consumption.

Figure 3:
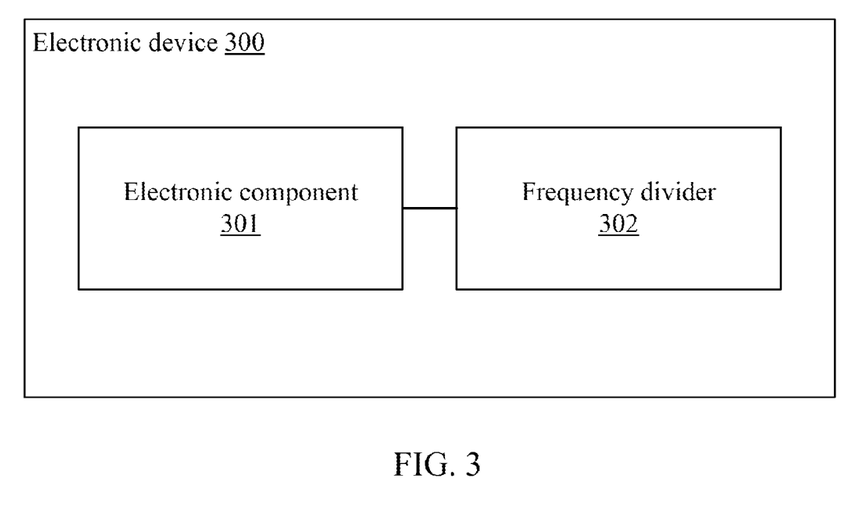
FIG. 3 shows a schematic block diagram that illustrates elements in an electronic device in accordance with one or more embodiments of the present invention.

FIG. 3 shows a schematic block diagram that illustrates elements in an electronic device 300 in accordance with one or more embodiments of the present invention. The electronic device 300 may include an electronic component 301 and a frequency divider 302 that is electrically connected to the electronic component 301. The frequency divider 302 may have one or more of the above-discussed features.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the invention, a frequency divider may include CMOS inverters connected in dynamic configurations. The frequency divider may include frequency dividers connected in a cascade connection structure. Advantageously, the frequency divider and/or an electronic device that includes the frequency divider may operate at a substantially high speed with substantially low power consumption and may operate in applications associated with high frequencies.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A frequency divider comprising:
   a first inverter;
   a second inverter, wherein an input terminal of the second inverter is electrically connected to an output terminal of the first inverter, wherein an output terminal of the second inverter is electrically connected to an output terminal of the frequency divider, wherein a power supply terminal of the second inverter is configured to receive a power supply voltage, wherein a ground terminal of the second inverter is configured to receive a reference voltage or is grounded;
   a third inverter, wherein an input terminal of the third inverter is electrically connected to the output terminal of the second inverter, and wherein an output terminal of the third inverter is electrically connected to an input terminal of the first inverter;
   a fourth inverter, wherein an input terminal of the fourth inverter is electrically connected to a first input terminal of the frequency divider, wherein an output terminal of the fourth inverter is electrically connected to a power supply terminal of the first inverter, wherein a power supply terminal of the fourth inverter is configured to receive the power supply voltage, and wherein a ground terminal of the fourth inverter is configured to receive the reference voltage or is grounded;
   a fifth inverter, wherein an input terminal of the fifth inverter is electrically connected to a second input terminal of the frequency divider, wherein an output terminal of the fifth inverter is electrically connected to a power supply terminal of the third inverter, wherein a power supply terminal of the fifth inverter is configured to receive the power supply voltage, and wherein a ground terminal of the fifth inverter is configured to receive the reference voltage or is grounded;
   a first transistor, wherein a source terminal of the first transistor is configured to receive the reference voltage or is grounded, wherein a drain terminal of the first transistor is electrically connected to a ground terminal of the first inverter, and wherein a gate terminal of the first transistor is electrically connected to the second input terminal of the frequency divider; and
   a second transistor, wherein a source terminal of the second transistor is configured to receive the reference voltage or is grounded, wherein a drain terminal of the second transistor is electrically connected to a ground terminal of the third inverter, and wherein a gate terminal of the second transistor is electrically connected to the first input terminal of the frequency divider.

2. The frequency divider of claim 1, wherein each of an electrical connection from the input terminal of the second inverter to the output terminal of the first inverter, an electrical connection from the power supply terminal of the second inverter to a power supply unit that is configured to provide the power supply voltage, and an electrical connection from the ground terminal of the second inverter to ground involves no intervening transistor.

3. The frequency divider of claim 1, wherein an electrical connection from the input terminal of the third inverter to the output terminal of the second inverter involves no intervening transistor, and wherein an electrical connection from the output terminal of the third inverter to the input terminal of the first inverter does not involve any intervening transistor.

4. The frequency divider of claim 1, wherein each of an electrical connection from the input terminal of the fourth inverter to the first input terminal of the frequency divider, an electrical connection from the output terminal of the fourth inverter to the power supply terminal of the first inverter, an electrical connection from the power supply terminal of the fourth inverter to a power supply unit that is configured to provide the power supply voltage, and an electrical connection from a ground terminal of the fourth inverter to ground involves no intervening transistor.

5. The frequency divider of claim 1, wherein each of an electrical connection from the input terminal of the fifth inverter to the second input terminal of the frequency divider, an electrical connection from the output terminal of the fifth inverter to the power supply terminal of the third inverter, an electrical connection from the power supply terminal of the fifth inverter to a power supply unit that is configured to provide the power supply voltage, and an electrical connection from the ground terminal of the fifth inverter to ground involves no intervening transistor.

6. The frequency divider of claim 1, wherein each of an electrical connection from the source terminal of the first transistor to ground, an electrical connection from the drain terminal of the first transistor to the ground terminal of the first inverter, and an electrical connection from the gate terminal of the first transistor to the second input terminal of the frequency divider involves no intervening transistor.

7. The frequency divider of claim 1, wherein each of an electrical connection from the source terminal of the second transistor to ground, and electrical connection from the drain terminal of the second transistor to the ground terminal of the third inverter, and an electrical connection from the gate terminal of the second transistor to the first input terminal of the frequency divider involves no intervening transistor.

8. The frequency divider of claim 1, wherein the fourth inverter includes a third transistor and a fourth transistor, wherein the third transistor is P-type, wherein the fourth transistor is N-type, wherein a source terminal of the third transistor is configured to receive the power supply voltage, wherein a drain terminal of the third transistor is electrically connected to a drain terminal of the fourth transistor, wherein a gate terminal of the third transistor is electrically connected to a gate terminal of the fourth transistor and is electrically connected to the first input terminal of the frequency divider, wherein a source terminal of the fourth transistor is configured to receive the reference voltage or is grounded.

9. The frequency divider of claim 1, wherein the fifth inverter includes a fifth transistor and a sixth transistor, wherein the fifth transistor is P-type, wherein the sixth transistor is N-type, wherein a source terminal of the fifth transistor is configured to receive the power supply voltage, wherein a drain terminal of the fifth transistor is electrically connected to a drain terminal of the sixth transistor, wherein a gate terminal of the fifth transistor is electrically connected to a gate terminal of the sixth transistor and is electrically connected to the second input terminal of the frequency divider, wherein a source terminal of the sixth transistor is configured to receive the reference voltage or is grounded.

10. The frequency divider of claim 1, wherein the first inverter includes a seventh transistor and an eighth transistor, wherein the eighth transistor is P-type, wherein the seventh transistor is N-type, wherein a source terminal of the eighth transistor is electrically connected to the output terminal of the fourth inverter, wherein a drain terminal of the eighth transistor is electrically connected to a drain terminal of the seventh transistor, wherein a gate terminal of the eighth transistor is electrically connected to a gate terminal of the seventh transistor, wherein a source terminal of the seventh transistor is electrically connected to a drain electrode of the first transistor.

11. The frequency divider of claim 1, wherein the second inverter includes a tenth transistor and a ninth transistor, wherein the tenth transistor is P-type, wherein the ninth transistor is N-type, wherein a source terminal of the tenth transistor is configured to receive the power supply voltage, wherein a drain terminal of the tenth transistor is electrically connected to a drain terminal of the ninth transistor, wherein both the drain terminal of the tenth transistor and the drain terminal of the ninth transistor are electrically connected to the output terminal of the frequency divider, wherein a gate terminal of the tenth transistor is electrically connected to a gate terminal of the ninth transistor and is electrically connected to the output terminal of the first inverter, wherein a source terminal of the ninth transistor is configured to receive the reference voltage or is grounded.

12. The frequency divider of claim 11, wherein each of the gate terminal of the tenth transistor and the gate terminal of the ninth transistor is electrically connected to drain terminals of two transistors of the first inverter.

13. The frequency divider of claim 1, wherein the third inverter includes an eleventh transistor and a twelfth transistor, wherein the twelfth transistor is P-type, wherein the eleventh transistor is N-type, wherein a source terminal of the twelfth transistor is electrically connected to the output terminal of the fifth inverter, wherein a drain terminal of the twelfth transistor is electrically connected to a drain terminal of the eleventh transistor, wherein a gate terminal of the twelfth transistor is electrically connected to a gate terminal of the eleventh transistor, wherein a source terminal of the eleventh transistor is electrically connected to a drain electrode of the second transistor.

14. The frequency divider of claim 13, wherein each of the gate terminal of the twelfth transistor and the gate terminal of the eleventh transistor is electrically to drain terminals of two transistors of the second inverter.

15. The frequency divider of claim 13, wherein each of the gate terminal of the twelfth transistor and the gate terminal of the eleventh transistor is electrically to the output terminal of the frequency divider.

16. The frequency divider of claim 1, wherein the first input terminal of the frequency divider and the second input terminal of the frequency divider are configured to receive a differential signal pair.

17. The frequency divider of claim 1, wherein the output terminal of the frequency divider includes a sixth inverter, wherein an input terminal of the sixth inverter is electrically connected to the output terminal of the second inverter, and wherein an output of the sixth inverter is an output of the frequency divider.

18. The frequency divider of claim 16, wherein an electrical connection from the input terminal of the sixth inverter to the output terminal of the second inverter involves no intervening transistor.

19. The frequency divider of claim 1, wherein the output terminal of the frequency divider includes a differential output structure.

20. An electronic device comprising:
an electronic component; and
a frequency divider electrically connected to the electronic component and comprising:
a first inverter;
a second inverter, wherein an input terminal of the second inverter is electrically connected to an output terminal of the first inverter, wherein an output terminal of the second inverter is electrically connected to an output terminal of the frequency divider, wherein a power supply terminal of the second inverter is configured to receive a power supply voltage, wherein a ground terminal of the second inverter is configured to receive a reference voltage or is grounded (or ground voltage);
a third inverter, wherein an input terminal of the third inverter is electrically connected to the output terminal of the second inverter, and wherein an output terminal of the third inverter is electrically connected to the input terminal of the first inverter;
a fourth inverter, wherein an input terminal of the fourth inverter is electrically connected to a first input terminal of the frequency divider, wherein an output terminal of the fourth inverter is electrically connected to a power supply terminal of the first inverter, wherein a power supply terminal of the fourth inverter is configured to receive the power supply voltage, and wherein a ground terminal of the fourth inverter is configured to receive the reference voltage or is grounded;

a fifth inverter, wherein an input terminal of the fifth inverter is electrically connected to a second input terminal of the frequency divider, wherein an output terminal of the fifth inverter is electrically connected to a power supply terminal of the third inverter, wherein a power supply terminal of the fifth inverter is configured to receive the power supply voltage, and wherein a ground terminal of the fifth inverter is configured to receive the reference voltage or is grounded;

a first transistor, wherein a source terminal of the first transistor is configured to receive the reference voltage or is grounded, wherein a drain terminal of the first transistor is electrically connected to a ground terminal of the first inverter, and wherein a gate terminal of the first transistor is electrically connected to the second input terminal of the frequency divider; and a second transistor, wherein a source terminal of the second transistor is configured to receive the reference voltage or is grounded, wherein a drain terminal of the second transistor is electrically connected to a ground terminal of the third inverter, and wherein a gate terminal of the second transistor is electrically connected to the first input terminal of the frequency divider.

* * * * *